(12) United States Patent
Shie et al.

(10) Patent No.: US 6,541,834 B1
(45) Date of Patent: Apr. 1, 2003

(54) SILICON PRESSURE MICRO-SENSING DEVICE AND THE FABRICATION PROCESS

(75) Inventors: Jin-shown Shie, Hsin Chu (TW); Ji-cheng Lin, Hsin Chu (TW); Chun-te Lin, Hsin Chu (TW); Chih-tang Peng, Hsin Chu (TW); Shih-han Yu, Hsin Chu (TW); Kuo-ning Chiang, Hsin Chu (TW)

(73) Assignee: Integrated Crystal Technology Corp. (TW)

( * ) Notice: Subject to any disclaimer, the term of this patent is extended or adjusted under 35 U.S.C. 154(b) by 0 days.

(21) Appl. No.: 09/975,125

(22) Filed: Oct. 9, 2001

(51) Int. Cl.[7] .............................................. H01L 29/82
(52) U.S. Cl. ...................................... 257/419; 257/414
(58) Field of Search ........................ 73/721, 724, 727, 73/718, 754, 755, 775, 517 R; 257/414–419; 438/50–53

(56) References Cited

U.S. PATENT DOCUMENTS

| | | | |
|---|---|---|---|
| 5,531,121 A | * 7/1996 | Sparks et al. | 73/716 |
| 5,654,244 A | * 8/1997 | Sakai et al. | 438/53 |
| 6,038,928 A | * 3/2000 | Maluf et al. | 73/724 |
| 6,376,291 B1 | * 4/2002 | Barlocchi et al. | 438/175 |
| 6,389,902 B2 | * 5/2002 | Aigner et al. | 73/754 |
| 6,465,855 B1 | * 10/2002 | Jaussaud et al. | 257/419 |

FOREIGN PATENT DOCUMENTS

EP        0474280        * 11/1992

* cited by examiner

*Primary Examiner*—Kamand Cuneo
*Assistant Examiner*—Asok Kumar Sarkar
(74) *Attorney, Agent, or Firm*—Martine & Penilla, LLP

(57) ABSTRACT

The invention is a silicon pressure micro-sensing device and the fabrication process thereof. The silicon pressure micro-sensing device includes a pressure chamber, and is constituted of a P-type substrate with a taper chamber and an N-type epitaxial layer thereon. On the N-type epitaxial layer are a plurality of piezo-resistance sensing units which sense deformation caused by pressure. The fabrication pressure of the silicon pressure micro-sensing device includes a step of first making a plurality of holes on the N-type epitaxial layer to reach the P-type substrate beneath. Then, by an anisotropic etching stop technique, in which etchant pass through the holes, a taper chamber is formed in the P-type substrate. Finally, an insulating material is applied to seal the holes, thus attaining the silicon pressure micro-sensing device that is able to sense pressure differences between two ends thereof.

2 Claims, 7 Drawing Sheets

SILICON PRESSURE MICRO-SENSING DEVICE AND THE FABRICATION PROCESS

BACKGROUND OF THE INVENTION

1. Field of Invention

The invention relates to a silicon pressure micro-sensing device and the fabrication process thereof, which require only a single substrate without any adhesion, and the fabrication for difficulty-free taper chamber meets.

2. Related Art

The history of pressure sensor development using silicon substrate as the base material is long-standing. Its sensing principle is based on the piezo-sensitivity of silicon. That is, when a resistor made by silicon substrate encounters pressure or deformation, the value of resistance thereof changes accordingly. In order to enhance the sensitivity to increasing deformation caused by pressure, a membrane structure is generally constructed to sustain a pressure difference on both ends. A piezo-resistance unit is preferably placed onto the area with the most membrane deformation, to attain the highest degree of sensitivity.

A piezo-resistance sensing unit made from monocrystalline silicon has the following advantages: (1) the sensing unit can be manufactured by semiconductor fabrication; (2) the membrane can be formed by a conventional anisotropic etching technique using bulk micro-machining technology. In addition, if the popular electro-chemical-etching-stop technique is utilized to implement the bulk micro-machining, a P-type silicon can be removed leaving an N-type silicon, thus forming an N-type stress membrane on a surface of the unit; (3) as a result of the membrane and the substrate being made from the same silicon, residual stress is unlikely to be present between the two, therefore the accuracy and yield of the product are both elevated. Micro pressure-sensing devices have for a long time mostly been produced by backside bulk micro-machining.

FIG. 1 shows a structure of a conventional sensing device. The conventional sensing device includes: a substrate 13, a membrane 14, and piezo-resistance sensing units 15. Anisotropic etching that starts upward from the bottom of the substrate 13 and narrows with a particular angle to the membrane 14 forms the conventional sensing unit. The particular angle is formed because the included angle between the inclined crystal plane (111) for etching stop and a horizontal plane is 54.7°. In accordance with this geometric structure, in order to obtain a larger area of the stress membrane 14, the bottom area of the substrate 13 is necessarily comparatively larger. This results in unnecessary silicon substrate loss in the substrate 13, causing a comparatively low yield; especially for a large-sized substrate that has a larger thickness as well as larger bottom openings, not only is more silicon substrate wasted, but the anisotropic etching process time is also prolonged, and these factors increase the cost.

In order to minimize substrate waste and increase the yield for each wafer, U.S. Pat. No. 6,038,928 discloses a structure formed by a front-side bulk micro-machining process.

FIG. 2 shows the structure of the sensing unit in the U.S. Pat. No. 6,038,928. Its fabrication process includes the following steps: First, a taper chamber 26 is formed on a silicon substrate 23 by conventional anisotropic etching, and then adhered to a P-type substrate 27 with an N-type epitaxial layer by wafer adhesion technology. Next, making use of the electro-chemical-etching-stop technique to etch away the P-type substrate 27 situated on top of the epitaxial layer and leaving an N-type epitaxial membrane 24, obtains an adhered wafer 28 with an inner chamber. Then, piezo-resistance sensing units 25 and metal lines (not shown) are formed by semiconductor fabrication and finally a structure for a pressure-sensing unit is obtained. In order to allow the taper chamber 26 an open access to the exterior; the back of the silicon substrate 23 is etched to form an opening 29. The taper chamber 26 of a die formed by front-side bulk the micro-machining process contracts downwards, therefore the needed supporting area on the sensing unit periphery is consequently much smaller.

Referring to FIG. 3, if the aforesaid membrane is in the shape of a square with each side length thickness of the wafer thickness at 400 $\mu$m, and the reserved width at the supporting periphery being 250 $\mu$m, the area of a conventional unit with back-side opening is hence approximately 265% larger than that of a unit with front-side opening. Naturally the number of sensing dies output per wafer decreases with the same percentage.

Although the front-side bulk micro-machining process has the advantage of reducing the area of the device, nevertheless, the fabrication process in the U.S. Pat. No. 6,038,928 essentially puts the costly substrate adhesion process into practice, which doubles the amount of wafer usage and implements two copious bulk micro-machining etching processes, with not only the cost increased, but defects during adhesion, which also cause a drop in production yield. In addition, the wafer after adhesion has a chamber structure, which may meet many unpredicted fabrication difficulties when a high temperature fabrication process required for making a piezo-resistance device is further performed.

SUMMARY OF THE INVENTION

In view of the need to improve the aforesaid prior art, one object of the invention is to provide a silicon pressure micro-sensing device and the fabrication process thereof, in which a front-side bulk micro-machining process is utilized to make the size of the required dies smaller than those processed by prior art processes.

Another object of the invention is to provide a silicon pressure micro-sensing device and the fabrication process thereof, in which the membrane taper chamber is made by a single substrate and requires no adhesion of two substrates. Thus, the amount of material used is decreased and the fabrication process is simplified so that the cost is significantly reduced.

A further object of the invention is to provide a silicon pressure micro-sensing device and the fabrication process thereof, in which the taper chamber and the sealed membrane are both processed at low temperature. Therefore, it is unnecessary to adjust the conventional fabrication process of piezo-resistance sensing units, leaving no impediments in the fabrication process.

The fabrication process of the silicon pressure micro-sensing device of the invention includes the following steps. First, a P-type (100) substrate with an N-type epitaxial layer thereon is prepared. Then, a plurality of piezo-resistance sensing units, a passivation, and a plurality of device pads are formed on the N-type epitaxial layer. Next, a deep-etching process is performed to the N-type epitaxial layer to form a plurality of holes, which pass through the N-type epitaxial layer to the P-type (100) substrate thereunder. It is followed by performing an etching-stop technique, in which an etchant goes through the holes to remove silicon of the P-type (100) substrate below the N-type epitaxial layer substrate, thus forming a taper chamber in the P-type (100) substrate. Finally, an insulating material is applied onto the N-type epitaxial layer to seal a plurality of holes and attain the desired silicon pressure micro-sensing device.

The silicon pressure micro-sensing device of the invention includes an N-type epitaxial layer which includes: a plurality of piezo-resistance units in the N-type epitaxial layer, for sensing pressure; a passivation layer formed on the N-type epitaxial layer, for preventing inappropriate etching from an etchant in the fabrication process; a plurality of device pads formed on the passivation layer and connected to the leads of an exterior circuit; a plurality of holes, which pass through the N-type epitaxial layer and the passivation so as to act as passages for the etchant; and an insulating membrane on the passivation to seal the plurality of holes. And the silicon pressure micro-sensing device also includes a P-type (100) substrate on a lower surface of the N-type epitaxial layer. It is a substrate with a taper chamber.

The aforesaid and other objects, characteristics, and advantages of the present invention, are illustrated more precisely by the detailed descriptions of the preferred embodiments below.

DETAILED DESCRIPTION OF THE PREFERRED EMBODIMENTS

FIGS. 4(a) to (f) are schematic diagrams showing the fabrication steps of the silicon pressure micro-sensing device of the invention.

Figure 1:
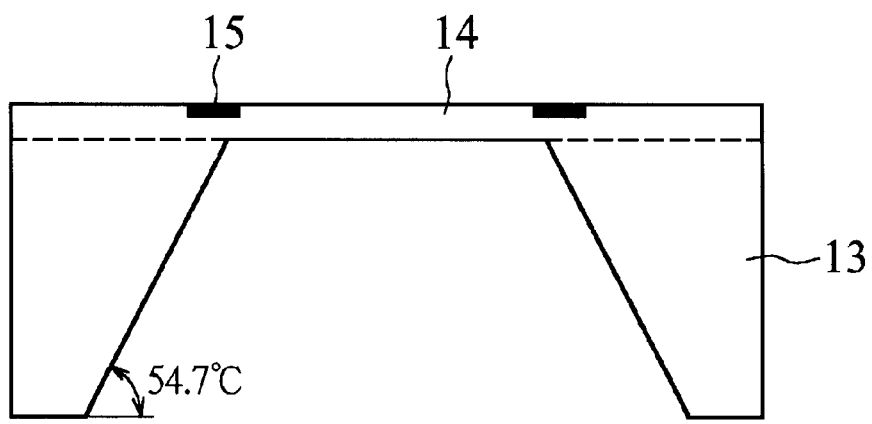
FIG. 1 shows the structure of a prior art sensing unit.
Figure 2:
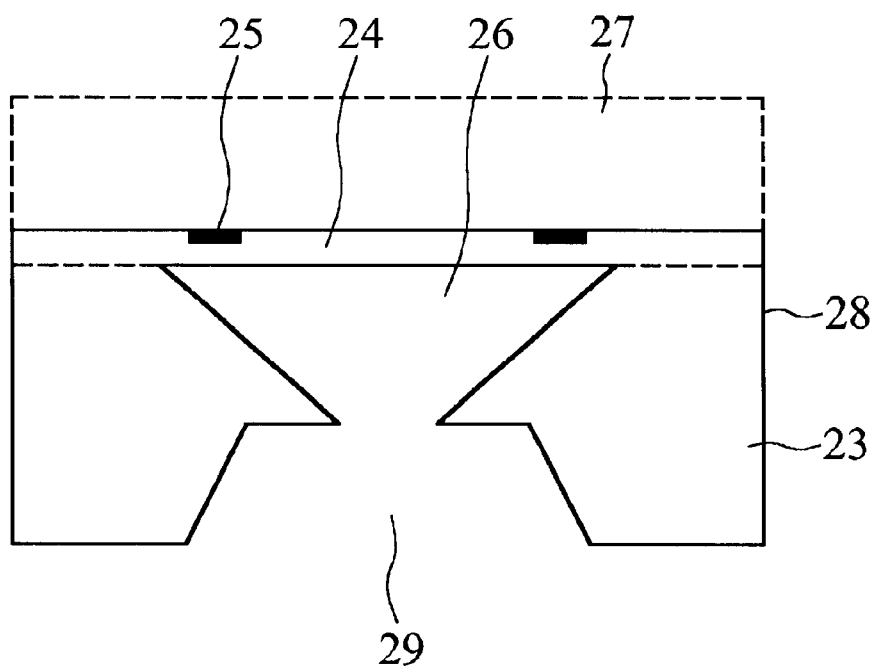
FIG. 2 shows the structure of a sensing unit in U.S. Pat. No. 6,038,928.
Figure 3:
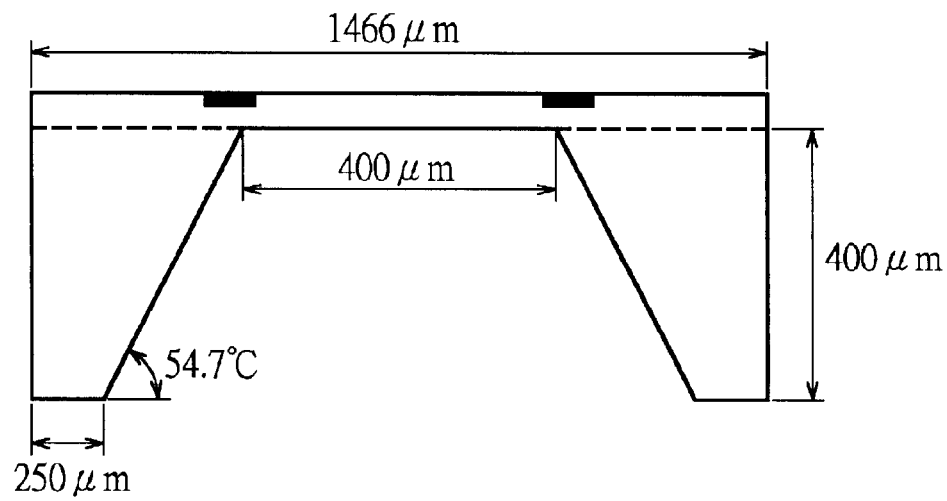
FIG. 3 shows the difference of wafer required by prior art and the U.S. Pat. No. 6,038,928.
Figure 3:
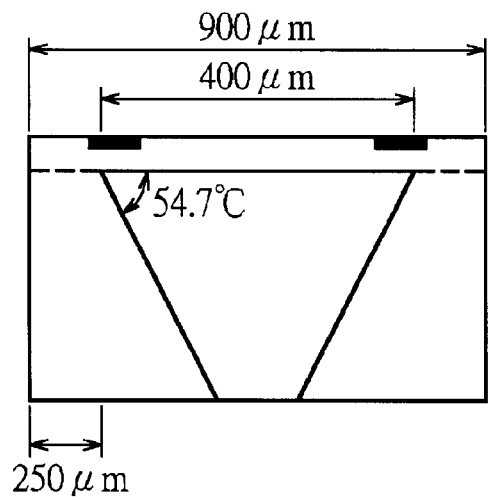
Figure 4A:
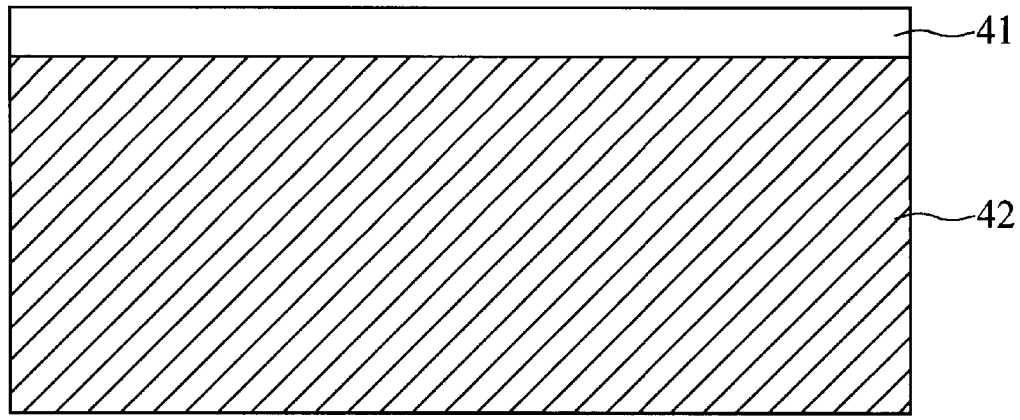
FIGS. 4(a) to (f) are schematic diagrams showing fabrication steps of the silicon pressure micro-sensing device of the invention.

FIG. 4(a) shows a P-type (100) substrate 42 with an N-type epitaxial layer 41 thereon.

Figure 4B:
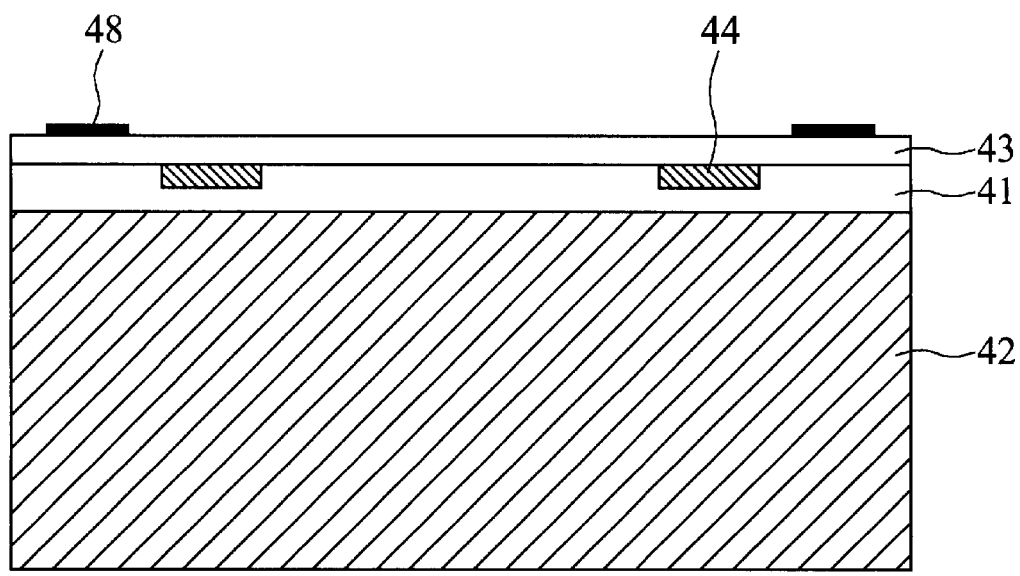

Referring to FIG. 4(b), a plurality of piezo-sensing units 44, a plurality of device pads 48, and a passivation layer 43 are formed on the N-type epitaxial layer 41 by conventional semiconductor fabrication processes.

Figure 4C:
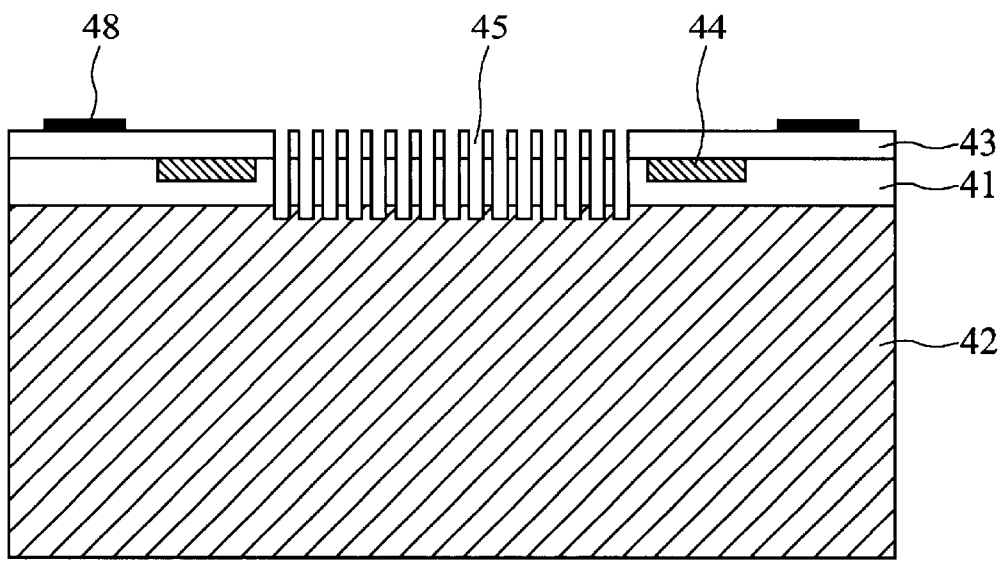

Referring to FIG. 4(c), a deep-etching process is utilized to form pluralities of holes 45, which pass through to the P-type substrate 42 beneath the N-type epitaxial layer 41.

Figure 4D:
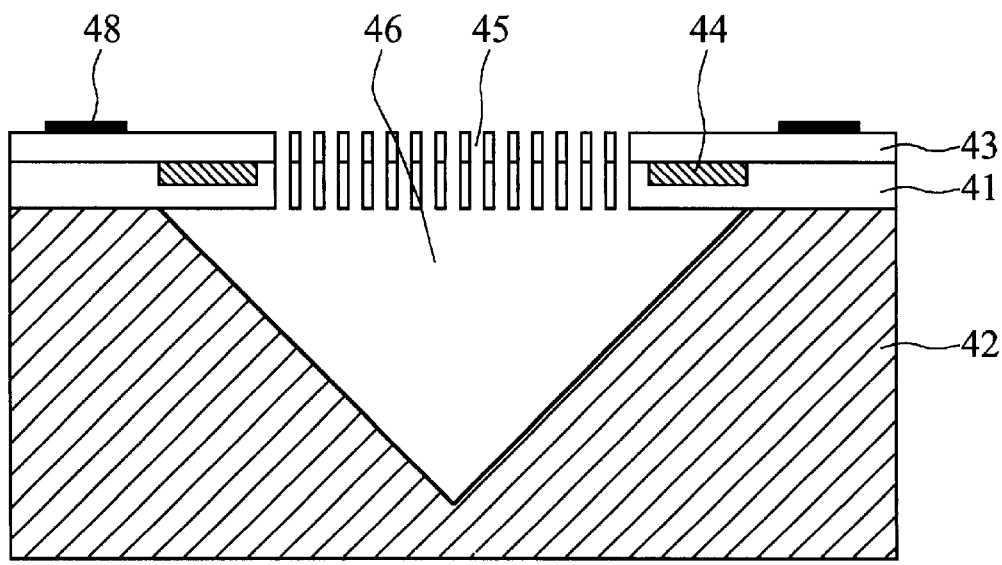

Referring to FIG. 4(d), an etching stop process is carried out to have the etchant go through a plurality of holes 45 to remove silicon of the P-type (100) substrate 42. Because the etchant possesses the characteristics of anisotropic etching, the taper chamber 46 in a shape of an inverted pyramid is formed along the crystal plane (111).

Figure 4E:
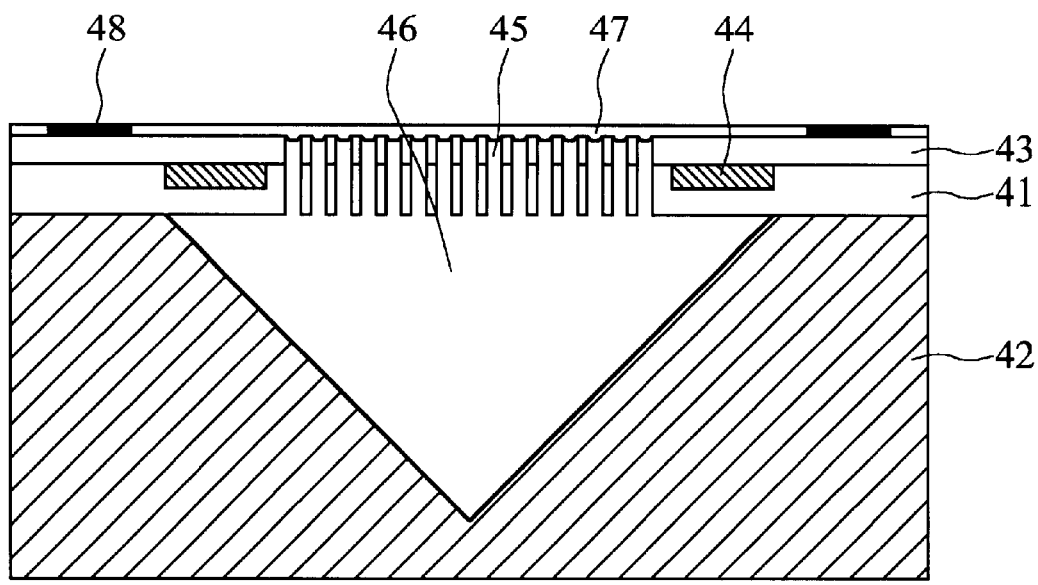

Referring to FIG. 4(e), a photosensitive polyamide membrane 47 is formed on the passivation 43 by spin on. Then, polyamide in the device pad 48 is removed by photolithography, so as to accommodate further testing and bonding processes. During the spin on process, due to factors such as contained air in the chamber and surface tension of the polyamide, the applied polyamide membrane does not sag or leak through the fine holes 45 to the taper chamber 46 thereunder. This step is to seal the plurality of holes 45 of the N-type epitaxial layer 41, so that upper and lower parts of the substrate achieve air-tightness. It should be noted that the polyamide as the sealing material mentioned above is only one of examples. In other cases, spin-on-glass (SOG) or silicone can also be used.

Figure 4F:
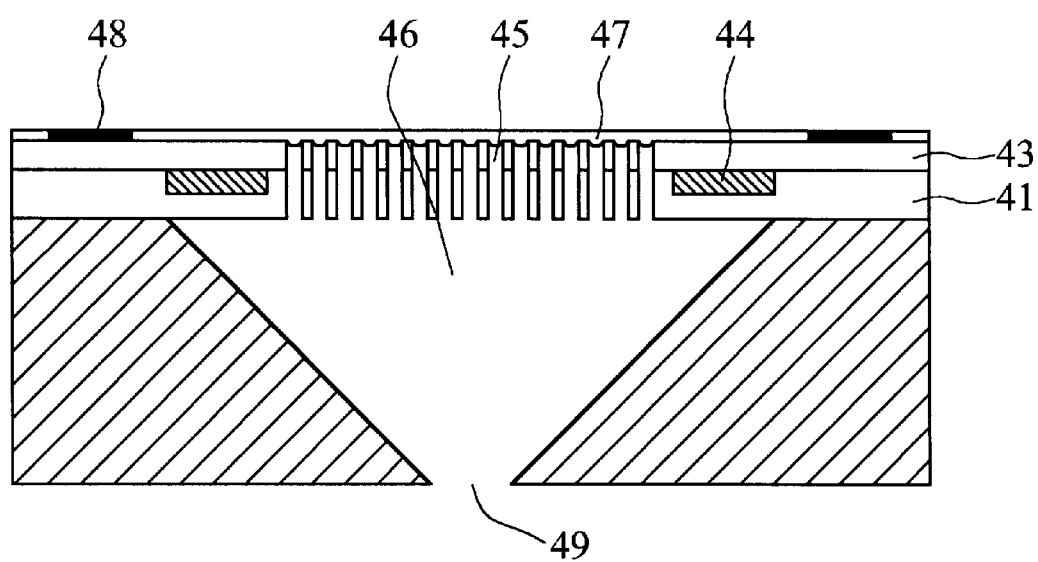

Referring to FIG. 4(f), after the above processes are completed, the pointed end at the bottom of the taper chamber 46 of the P-type (100) 42 is made to have an open access to exterior and acts as a venthole 49, which contributes to gauge pressure.

The aforesaid fabrication processes of the silicon pressure micro-sensing device are all low temperature fabrication processes, therefore it is unnecessary to vary general conditions of the fabrication process for piezo-resistance sensing units, and creates no impediments to its fabrication.

Figure 5A:
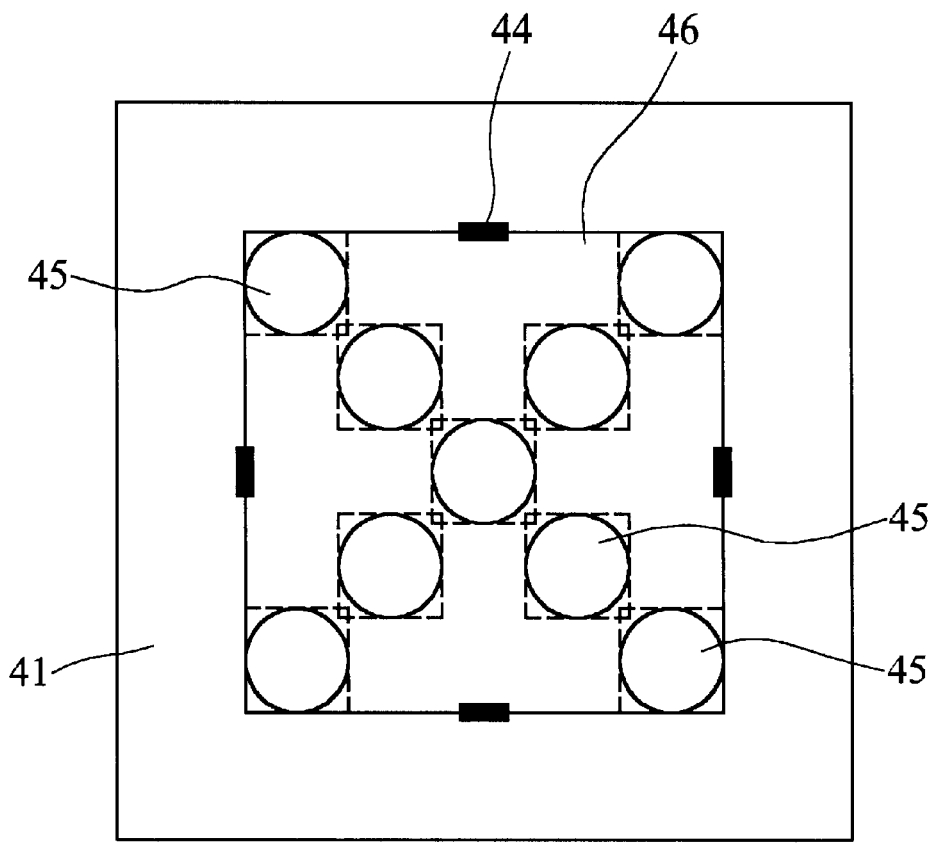
FIGS. 5(a) to 5(b) are schematic diagrams showing the structure of a plurality of holes.
Figure 5B:
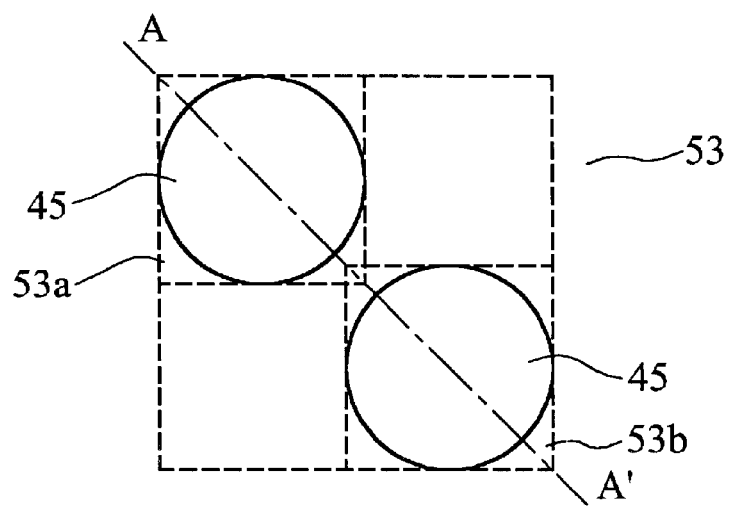

In order to form the taper chamber 46 shown in FIG. 4(d) while be able to keep most of the N-type epitaxial layer 41, the holes 45, as shown in FIG. 5, have to possess the following attributes: (1) the number of holes must be plural; (2) the plurality of holes 45 must be close enough, so that initial tiny taper chambers from individual openings are able to connect with each other and continuously expand to become a larger taper chamber, until the largest single taper chamber 46 is formed circumscribing the outmost holes. Such a mechanism of etching and then extending is a characteristic of silicon wafer anisotropic etching. Referring to FIG. 5(b), each circumscribed square 53a of hole 45 overlaps with another circumscribed square 53b to form a larger square 53.

Figure 6A:
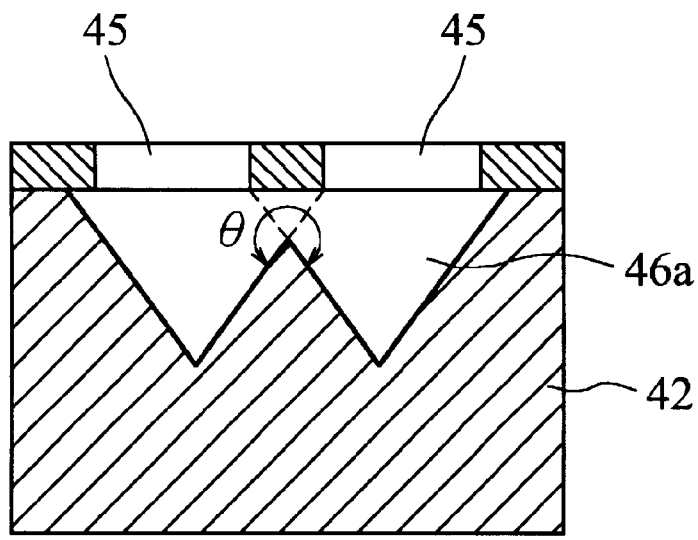
FIGS. 6(a) and (b) are sectional schematic diagrams showing the taper chamber of the invention based on FIG. 5(b) viewing from line AA'.
Figure 6B:
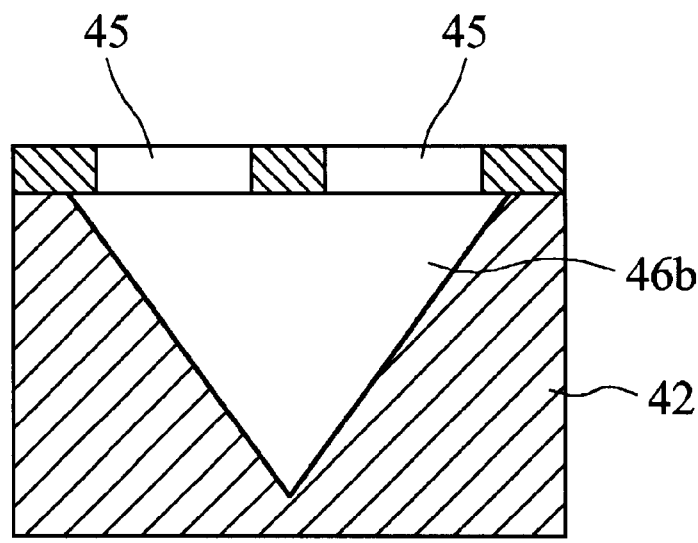

FIGS. 6(a) to (b) are sectional schematic diagrams showing the taper chamber of the invention based on FIG. 5(b) viewing from line AA'. By an etching stop process, the etchant through a plurality of holes 45 removes silicon of the P-type (100) substrate 42 thereunder. The initial shape etched is in the form of a cone. Referring to FIG. 6(a), due to the anisotropic etching characteristic possessed by the etchant, an acute angle is developed between the crystal planes (111) of the cones etched, and the cones become tetragonal tapers 46a. When two adjacent tetragonal tapers meet, the two crystal planes (111) thereof create an obtuse angle θ, which is not exempted from being etched; hence the tetragonal taper 46a becomes an even larger tetragonal taper 46b. At this point, only an acute angle is present between the crystal planes (111) of the largest taper chamber and the etching is therefore stopped. As shown in FIG. 6(b), adjacent tetragonal tapers 46a become a larger tetragonal taper 46b, so that etching proceeds until the formation of the largest taper chamber is achieved.

FIG. 4(e) shows the structure of the first embodiment of the silicon pressure micro-sensing device of the present invention. The silicon pressure micro-sensing device includes: an N-type epitaxial layer 41, a P-type (100) substrate 42, a passivation layer 43, a plurality of piezo-resistance sensing units 44, a plurality of holes 45, a taper chamber 46, a membrane 47, and a plurality of device pads 48.

The P-type (100) substrate 42 is a base of the silicon pressure micro-sensing device with the taper chamber 46. The N-type epitaxial layer 41 is on the upper surface of the P-type (100) substrate 42. The pluralities of piezo-resistance sensing units 44 are in the N-type epitaxial layer 41, to sense pressure. The passivation layer 43 is formed on the upper surface of the N-type epitaxial layer 41, to avoid inappropriate etching from the etchant in the fabrication process. The plurality of device pads 48 are formed on the upper surface of the passivation layer 43, and are connected to leads of an external circuit (not shown). The plurality of holes 45 pass through the N-type epitaxial layer 41 and the passivation layer 43, and are passages for the etchant so as to carry out the etching-stop process. The membrane 47 is formed on the upper surface of the passivation layer 43 and seals the holes 45 to have the taper chamber 46 an air-tight isolation.

FIG. 4(f) shows the structure of the second embodiment of the silicon pressure micro-sensing device of the invention. The silicon pressure micro-sensing device includes: an N-type epitaxial layer 41, a P-type (100) substrate 42, a passivation layer 43, a plurality of piezo-resistance sensing units 44, a plurality of holes 45, a taper chamber 46, a membrane 47, a plurality of device pads 48, and a venthole 49.

In order to simplify the illustration, the following solely distinguishes the differences between the first embodiment and the second embodiment. In the second embodiment, the venthole 49 is added to the bottom of the taper chamber 46, for measuring pressure.

While the invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the invention.

What is claimed is:

1. A silicon pressure micro-sensing device comprising:
   an N-type epitaxial layer comprising:
      a plurality of piezo-resistance sensing units, for sensing pressure, in said N-type epitaxial layer; a passivation, for preventing inappropriate etching from etchant in the process, on an upper surface of said N-type epitaxial layer; a plurality of device pads formed on an upper surface of the passivation and connected to leads of an external circuit; a plurality of holes which go through said N-type epitaxial layer and passivation and act as passages for the etchant; and an insulating membrane on the upper surface of said passivation to seal said plurality of holes; and
   a P-type (100) substrate with a taper chamber and on a lower surface of said N-type epitaxial layer.

2. The silicon pressure micro-sensing device as described in claim 1, wherein said P-type (100) substrate further comprises a venthole at a bottom part of said taper chamber.

\* \* \* \* \*